United States Patent
Lim (10) Patent No.: US 10,748,978 B2
(45) Date of Patent: Aug. 18, 2020

(54) DISPLAY DEVICE

(71) Applicant: LG Display Co., Ltd., Seoul (KR)

(72) Inventor: SangHyun Lim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/211,073

(22) Filed: Dec. 5, 2018

(65) Prior Publication Data

US 2019/0181213 A1 Jun. 13, 2019

(30) Foreign Application Priority Data

Dec. 12, 2017 (KR) .................. 10-2017-0170343

(51) Int. Cl.
| | |
|---|---|
| *G09G 3/3291* | (2016.01) |
| *G09G 3/3266* | (2016.01) |
| *G09G 3/3225* | (2016.01) |
| *H01L 27/32* | (2006.01) |

(52) U.S. Cl.
CPC ....... *H01L 27/3276* (2013.01); *G09G 3/3225* (2013.01); *G09G 3/3266* (2013.01); *G09G 3/3291* (2013.01); *H01L 27/3246* (2013.01); *G09G 2300/0413* (2013.01); *G09G 2300/0426* (2013.01); *G09G 2300/0452* (2013.01); *G09G 2310/0221* (2013.01); *G09G 2310/0232* (2013.01); *G09G 2310/0281* (2013.01); *G09G 2320/0223* (2013.01)

(58) Field of Classification Search
CPC ............. H01L 27/3276; H01L 27/3246; H01L 27/124; H01L 27/1255; G09G 3/3225; G09G 3/3266; G09G 3/3291; G09G 2300/0413; G09G 2300/0426; G09G 2300/0452; G09G 2310/0221; G09G 2310/0232; G09G 2310/0281; G09G 2320/0223

See application file for complete search history.

(56) References Cited

U.S. PATENT DOCUMENTS

2017/0301280 A1\* 10/2017 Ka .................. G09G 3/3406
2018/0129111 A1    5/2018 Wu et al.

FOREIGN PATENT DOCUMENTS

| | | |
|---|---|---|
| CN | 107342036 A | 11/2017 |
| WO | WO 2017/172375 A1 | 10/2017 |

OTHER PUBLICATIONS

European Patent Office, Partial European Search Report, EP Patent Application No. 18210419.0, dated Feb. 13, 2019, 14 pages.
European Patent Office, Extended European Search Report and Opinion, EP Patent Application No. 18210419.0, dated Jun. 14, 2019, 19 pages.

\* cited by examiner

*Primary Examiner* — Brent D Castiaux
(74) *Attorney, Agent, or Firm* — Fenwick & West LLP (57) ABSTRACT

The display device according to the present disclosure includes a substrate which includes a display area having an irregularly shaped side and a non-display area which includes a notch area defined by a shape of the irregularly shaped side of the display area and is disposed to enclose the display area. A connecting metal line which electrically connects a plurality of gate lines disposed to be divided due to formation of the irregularly shaped side is formed so that a scan load amount due to a length difference of the plurality of gate lines may be compensated.

12 Claims, 7 Drawing Sheets

| | τ OF Ref. AREA | τ OBTAINED BY CONSIDERING NUMBER OF PIXELS OF NOTCH AREA | τ WHICH NEEDS TO BE COMPENSATED (Ref − Notch) | CONVERTED Cap WHICH NEEDS TO BE COMPENSATED |
|---|---|---|---|---|
| Ref. | 72190.5137 | 7.22E+04 | 0 | 0 |
| Notch A | 72190.5137 | 4.00E+04 | 32182.70926 | 7194.985557 |
| Notch B | 72190.5137 | 3.57E+04 | 36465.36553 | 6995.305304 |
| Notch C | 72190.5137 | 3.35E+04 | 38686.7835 | 6759.882933 |
| Notch D | 72190.5137 | 3.18E+04 | 40372.65619 | 6560.145532 |
| Notch E | 72190.5137 | 3.03E+04 | 41885.22431 | 6445.277059 |

FIG. 6

DISPLAY DEVICE

CROSS-REFERENCE TO RELATED APPLICATIONS

This application claims the priority to Republic of Korea Patent Application No. 10-2017-0170343 filed on Dec. 12, 2017, in the Korean Intellectual Property Office, the disclosure of which is incorporated herein by reference in its entirety.

BACKGROUND

Field

The present disclosure relates to a display device, and more particularly, to a display device having an irregularly shaped structure.

Description of the Related Art

Various display devices are currently being developed and marketed. For example, there are display devices such as a liquid crystal display device (LCD), a field emission display device (FED), an electro phoretic display device (EPD), an electro-wetting display device (EWD), an organic light emitting display device (OLED), and a quantum dot display device (QD).

A display device includes a display area in which a plurality of pixels is disposed to display images and a non-display area which encloses the display area. In the non-display area, images are not displayed. In this case, in the display area, a plurality of pixels may be defined. Further, in the non-display area, wiring lines and circuits for transmitting various signals to the plurality of pixels are disposed.

As the technology for implementing such a display device has been developed and a large number of products have been mass-produced, technologies for implementing a design desired by a consumer have been mainly developed for the display device. One of them is a variety of shapes of a display area in which the image is implemented. Specifically, various shapes of the display area are required other than a rectangular shape.

SUMMARY

The present disclosure relates to a difference between a scan load of a display area having an irregularly shaped side and a scan load of a display area which does not have an irregularly shaped side which causes a sampling voltage difference to deteriorate a display quality of the display device.

Therefore, the present disclosure relates to a display device having a novel structure for solving the problems caused by a scan load difference which may be generated in the display device having an irregularly shaped structure.

Specifically, an object to be achieved by the present disclosure is to provide a display device which disposes a scan load compensating pattern in a notch area formed due to an irregularly shaped side to compensate a scan load difference of the display area due to the formation of the irregularly shaped side.

Objects of the present disclosure are not limited to the above-mentioned objects, and other objects, which are not mentioned above, can be clearly understood by those skilled in the art from the following descriptions.

According to an aspect of the present disclosure, a display device includes: a substrate which includes a display area having an irregularly shaped side and a non-display area which includes a notch area defined by a shape of the irregularly shaped side of the display area and is disposed to enclose the display area; a plurality of gate lines which is divided to be disposed in a left display area and a right display area by the irregularly shaped side of the display area; and a connecting metal line which connects the plurality of gate lines divided to be disposed in the left display area and the right display area in the notch area. Therefore, in the display device according to the aspect of the present disclosure, a connecting metal line which electrically connects the plurality of gate lines disposed to be divided due to the formation of the irregularly shaped side is formed, thereby lowering the scan load difference due to the length difference of the plurality of gate lines.

According to another aspect of the present disclosure, a display device includes: a plurality of pixels disposed in a display area where images are displayed; a plurality of gate lines which apply a gate signal to the plurality of pixels and is disposed to be divided due to one or more irregularly shaped side among four sides of the display area; a plurality of power lines which applies a high-potential power and a low-potential power to the plurality of pixels; a plurality of connecting metal lines which are disposed below the plurality of power lines and connect the plurality of gate lines which are disposed to be divided due to the irregularly shaped side; and a capacitance compensating pattern disposed below the plurality of connecting metal lines. Therefore, in the display device according to another aspect of the present disclosure, the capacitance compensating pattern is formed to compensate the RC delay of the display area which has an irregularly shaped side based on the RC delay of the display area which does not have an irregularly shaped side, thereby minimizing a luminance irregularity of the display device.

Other detailed matters of the embodiments are included in the detailed description and the drawings.

According to the present disclosure, the scan load compensating pattern, that is, a connecting metal line which connects gate lines of the second display area divided due to the notch area, is disposed in the notch area, thereby lowering a scan load difference of the display area due to the irregularly shaped side.

According to the present disclosure, the connecting metal line disposed in the notch area is disposed to overlap a high potential power link line or a low potential power link line to compensate a capacitance, thereby minimizing deterioration of a display quality due to the irregularly shaped side.

The effects according to the present disclosure are not limited to the contents exemplified above, and more various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION OF THE EMBODIMENT

Advantages and characteristics of the present disclosure and a method of achieving the advantages and characteristics will be clear by referring to exemplary embodiments described below in detail together with the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways, and the embodiments can be carried out independently of or in association with each other.

Hereinafter, the present disclosure will be described in detail with reference to the drawings.

Figure 1:
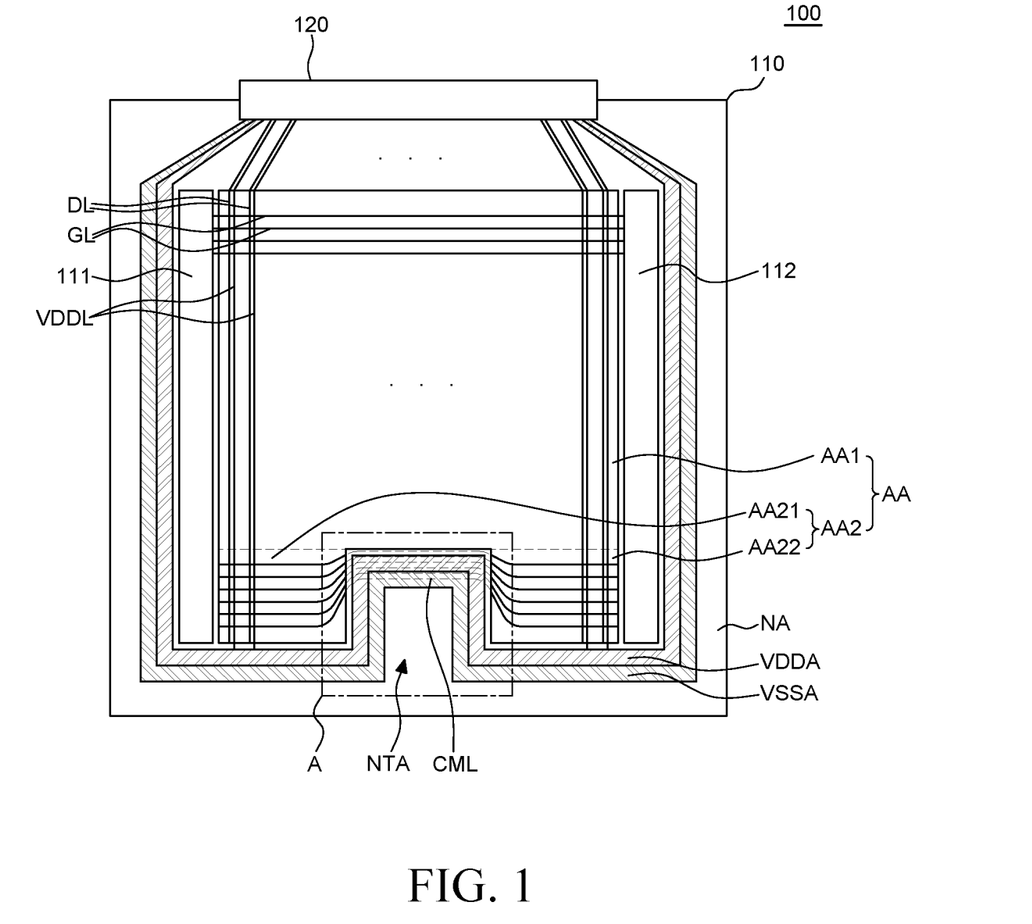
FIG. 1 is a plan view of a display device according to an exemplary embodiment of the present disclosure.

FIG. 1 is a plan view of a display device according to an exemplary embodiment of the present disclosure. Referring to FIG. 1, a display device 100 according to an exemplary embodiment of the present disclosure includes a substrate 110, a first gate driver 111, a second gate driver 112, a data driver 120, a high-potential power link line area VDDA, a low-potential power link line area VSSA, a gate line GL, a data line DL, a high-potential power supply line VDDL, and a low-potential power supply line (not illustrated).

The substrate 110 supports and protects various components of the display device 100, and the substrate 110 may be formed of glass or a plastic material having flexibility. When the substrate 110 is formed of a plastic material, for example, the substrate may be formed of polyimide (PI), but, it is not limited thereto.

In the substrate 110, the display area AA and the non-display area NA enclosing the display area AA may be defined.

The display area AA is an area in which an image is displayed in the display device 100. A display unit, various driving elements for driving the display unit, and signal lines are disposed in the display area AA. For example, the display unit may be an organic light emitting display unit which is configured by an organic light emitting diode including an anode, an organic light emitting layer, and a cathode. However, the display unit is not limited thereto, but may be a liquid crystal display unit which drives liquid crystals by an electric field generated by a voltage applied to a pixel electrode and a common electrode. Further, various driving elements for driving the display unit, such as thin film transistors or capacitors, may be disposed in the display area AA. Furthermore, as illustrated in FIG. 1, a plurality of signal lines, such as gate lines GL, data lines DL, and the high-potential power supply line VDDL, may be disposed in the display area AA.

A plurality of pixels is disposed in the display area AA. Each of the plurality of pixels is a minimum unit which emits light and includes a red pixel, a green pixel, and a blue pixel. The plurality of pixels may further include a white pixel. Each of the plurality of pixels of the display area AA may be connected to the gate line GL, the data line DL, and the high-potential power supply line VDDL.

Referring to FIG. 1, in the display area AA, one of four sides which form the display area AA may be an irregularly shaped side having an irregularly shaped structure. Here, the irregularly shaped side may be one of vertical sides or horizontal sides. The irregularly shaped side means a side having a curved shape, rather than a straight side. Further, in the exemplary embodiment of the present disclosure, the irregularly shaped structure is a structure generated by an irregularly shaped side. The irregularly shaped structure may refer to an irregular shape formed by deformation of a polygon such as a circle, a triangle, a rectangle, a rhombus, a pentagon, or a hexagon so that it is difficult to be defined as a polygon. The irregularly shaped structure may also refer to a shape in which pixels are not disposed in the display area AA so that when an image is displayed, an area in which the pixels are not disposed is visually recognized.

Referring to FIG. 1, a lower side of the display area AA is an irregularly shaped side. In the exemplary embodiment of the present disclosure, an upper area of the display area which does not include an irregularly shaped side is referred to as a first display area AA1 and a lower area of the display area AA which includes an irregularly shaped side is referred to as a second display area AA2.

The second display area AA2 may include a second-first display area AA21 and a second-second display area AA22 which are separated to the left and right due to the irregularly shaped side disposed at a center portion. The second-first display area AA21 may receive an applied gate signal from the first gate driver 111. The second-second display area AA22 may receive an applied gate signal from the second gate driver 112. The irregularly shaped side of the second display area AA2 is inwardly recessed toward an upward direction of the display area AA so that an irregularly shaped structure having a concave shape corresponding to the irregularly shaped side may be defined. Since pixels are not disposed in a portion of the second display area AA2 where the irregularly shaped side is recessed, images are not displayed in the portion. Therefore, the position may be defined as a notch area NTA. Therefore, a display size of the second display area AA2 may be different from a display size of the first display area AA1. That is, the display size of the second display area AA2 may be smaller than the display size of the first display area AA1.

Since the images are not displayed in the notch area NTA, the notch area may be included in the non-display area NA. In the notch area NTA formed by a recessed irregularly shaped side, physical components, for example, a button, a speaker, or a switch, are disposed to implement other functions of the display device 100. Specifically, since one of four sides of the display area AA is configured as an irregularly shaped side having an irregularly shaped structure, a length of the gate line GL according to an exemplary embodiment of the present disclosure which is disposed in the first display area AA1 without having an irregularly shaped structure and a length of the gate line which is disposed in the second display area AA2 having an irregularly shaped structure are different from each other. That is, the second display area AA2 is divided into the second-first display area AA21 and the second-second display area AA22 due to the notch area NTA in which pixels are not disposed so that lengths of the lines may be shorter than that of the first display area AA1. Therefore, there may be a load amount difference between the gate line GL disposed in the first display area AA1 and the gate line GL of the second display area AA2. In order to compensate the difference, a plurality of connecting metal lines CML may be disposed to electrically connect the plurality of gate lines GL disposed in the second-first display area AA21 and the plurality of gate lines GL disposed in the second-second display area AA22.

In FIG. 1, as a modified example of the rectangular display area AA, a shape in which a part of one side of the rectangle is recessed is illustrated, but is not limited thereto and may be implemented by various shapes. For example, a plurality of sides of the display area AA may be implemented as irregularly shaped sides, and holes having various shapes may be formed in the display area AA. In the area in the hole, pixels are not disposed so that images are not displayed. Therefore, the area in the hole may be included in the non-display area NA.

The non-display area NA is an area where images are not displayed, and the non-display area NA may be defined as an area enclosing the display area AA. Various components for driving the plurality of pixels disposed in the display area AA may be disposed in the non-display area NA. For example, as illustrated in FIG. 1, first and second gate drivers 111 and 112, a high-potential power link line area VDDA, and a low-potential power link line area VSSA may be disposed in the non-display area NA of the substrate 110. Further, as described above, since the display area AA has an irregularly shaped structure, the non-display area NA also has an irregularly shaped structure. That is, as illustrated in FIG. 1, the non-display area NA also has a shape according to the irregularly shaped structure of the display area AA and this area may be referred to as a notch area NTA.

The first and second gate drivers 111 and 112 output the gate signal to the plurality of gate lines GL of the display area AA based on a gate control signal output from the timing controller and selects a pixel to which a data voltage is charged. More specifically, the first gate driver 111 outputs a gate signal to the plurality of gate lines GL disposed in the second-first display area AA21 and the second gate driver 112 may output a gate signal to a plurality of gate lines GL disposed in the second-second display area AA22.

The high-potential power link line area VDDA may be an area where a plurality of high-potential power link lines which are supplied with a high-potential voltage from the data driver 120 to transmit the voltage to the high-potential power supply line VDDL of the display area AA is disposed. The plurality of high-potential power link lines disposed in the high-potential power link line area VDDA may be disposed to enclose the display area AA. Specifically, the plurality of high-potential power link lines disposed in the high-potential power link line area VDDA may be disposed along a shape of the irregularly shaped side. Referring to FIG. 1, since the high-potential power link line area VDDA has a concave shape which is formed in an inward direction of the display area AA due to the irregularly shaped side, the high-potential power link line area VDDA may also be disposed to have a concave shape. The high-potential power link line area VDDA may be connected to a plurality of high-potential power supply lines VDDL of the display area AA. The plurality of high-potential power supply lines VDDL is for transmitting a high-potential voltage to each pixel of the display area AA. The plurality of high-potential power supply lines VDDL may be electrically connected to the plurality of high-potential power link lines (not illustrated) disposed in the high-potential power link line area VDDA, respectively.

A low-potential power link line area VSSA may be an area where a plurality of low-potential power link lines which is supplied with a low-potential voltage from the data driver 120 to transmit the low-potential voltage to each pixel. The plurality of low-potential power link line disposed in the low-potential power link line area VSSA may enclose the display area AA. Specifically, the plurality of low-potential power link lines disposed in the low-potential power link line area VSSA may be disposed along a shape of the irregularly shaped side. Referring to FIG. 1, since the second display area AA2 has a concave shape which is formed in an inward direction of the display area AA due to the irregularly shaped side, the low-potential power link line area VSSA may also be disposed to have a concave shape. The low-potential power link line area VSSA is connected to the low-potential power supply line (not illustrated) of the display area AA. Even though in the exemplary embodiment of the present disclosure, it is described that the low-potential power supply line is disposed in the pixel area, the low-potential power supply line may be integrally formed to enclose the display area AA.

The high-potential power supply line VDDL and the low-potential power supply line may be formed of the same material. For example, the high-potential power supply line VDDL and the low-potential power supply line may be formed of the same material as a source electrode and a drain electrode of a thin film transistor disposed in the display area AA. Although in the exemplary embodiment of the present disclosure, it is described that the high-potential power supply line VDDL and the low-potential power supply line are formed of the same material, it is not limited thereto. For example, the high-potential power supply line VDDL may be formed of the same material as the source electrode and the drain electrode of the thin film transistor disposed in the display area AA. The low-potential power supply line may be formed of the same material as a gate electrode of the thin film transistor disposed in the display area AA.

A plurality of data lines DL is disposed in the display area AA. The plurality of data lines DL is for transmitting a data voltage to each pixel of the display area AA. The plurality of data lines DL is connected to the data driver 120 via a data link line.

The data driver 120 outputs a data signal, which is generated based on a data driving control signal transmitted from the timing controller, to the data line DL of the display area AA. As illustrated in FIG. 1, the data driver 120 may be included in the flexible substrate 110 or may be disposed as a chip-on-film type. Even though not specifically illustrated in FIG. 1, the chip-on-film type refers to a structure in which a data driving chip is disposed on a flexible base film. The chip-on-film type data driver 120 is disposed to be electrically connected to a data driving pad (not illustrated) disposed on the substrate 110 and may be electrically connected to the substrate 110 and a printed circuit board disposed at the outside through the plurality of signal lines disposed on the base film.

Figure 2:
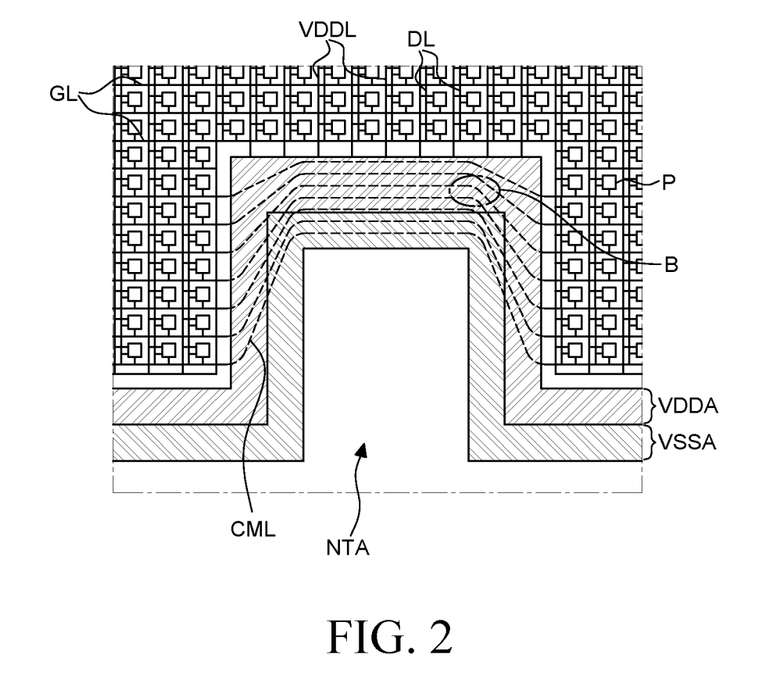
FIG. 2 is an enlarged view of an area A of FIG. 1.
Figure 3:
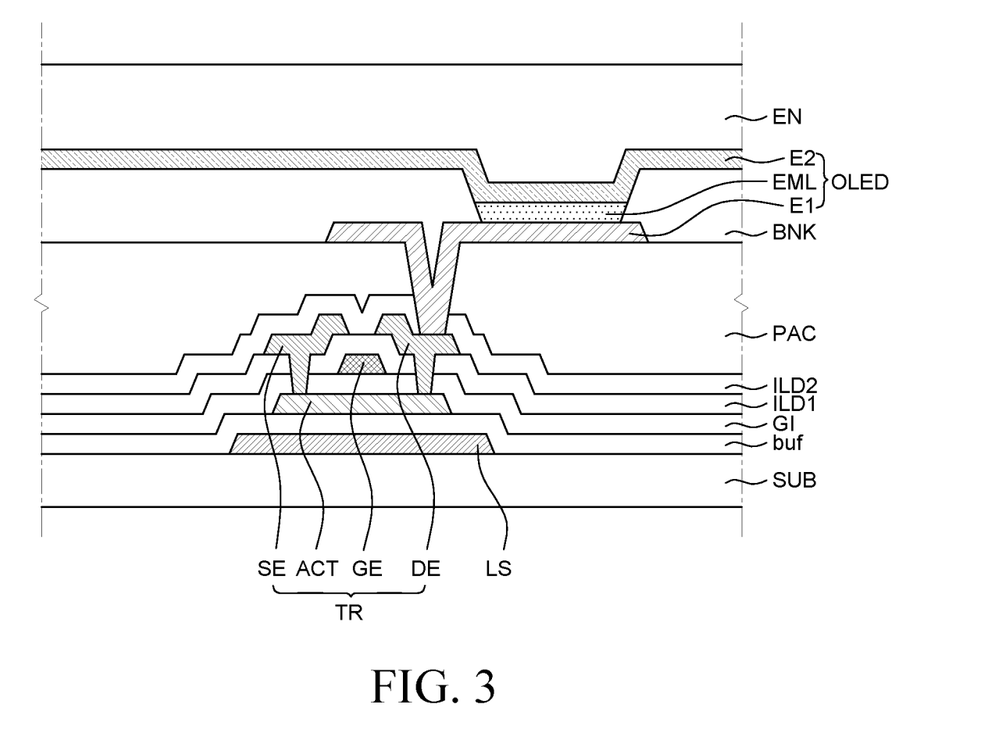
FIG. 3 is a cross-sectional view of a pixel structure of a display device according to an exemplary embodiment of the present disclosure.
Figure 4:
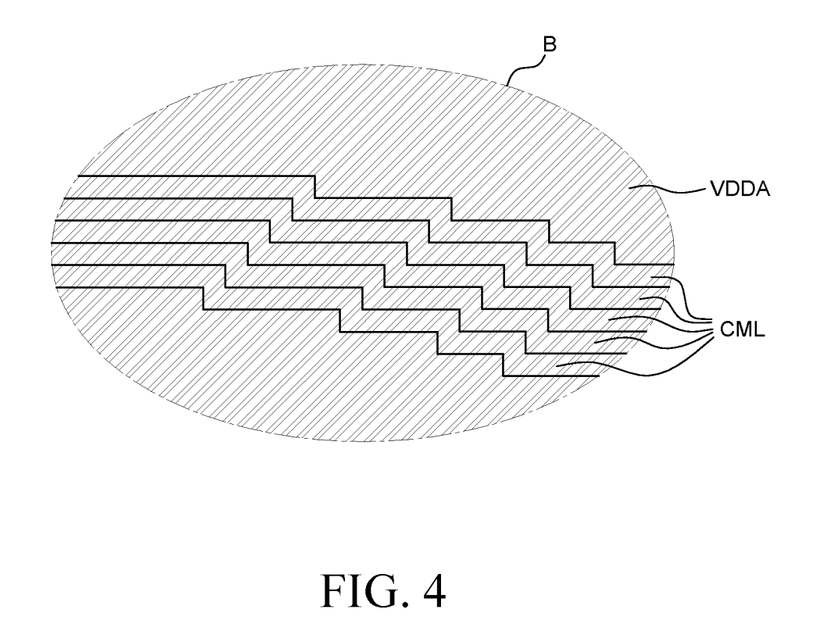
FIG. 4 is an enlarged view of an area B of FIG. 1.
Figure 5A:
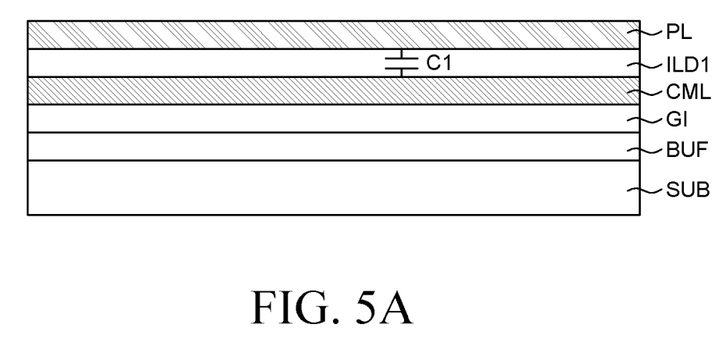
FIGS. 5A to 5C are cross-sectional views for explaining overlapping between a power line and a connecting metal line of a display device according to an exemplary embodiment of the present disclosure.
Figure 5B:
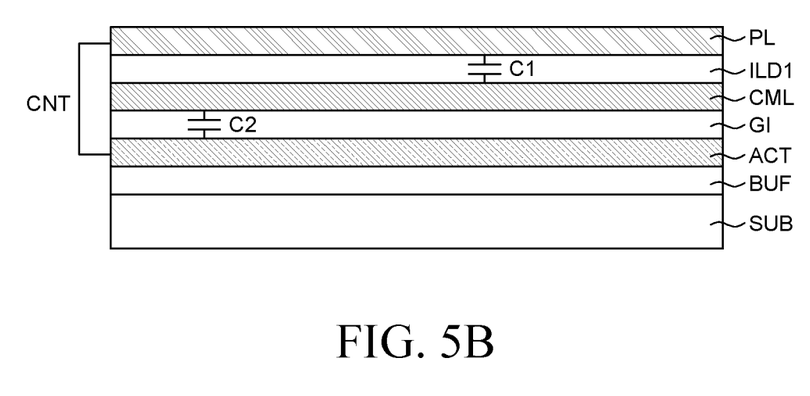
Figure 5C:
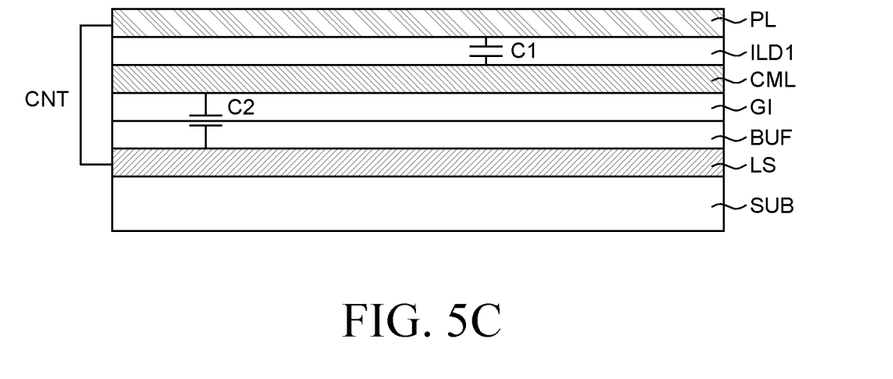
Figure 6:
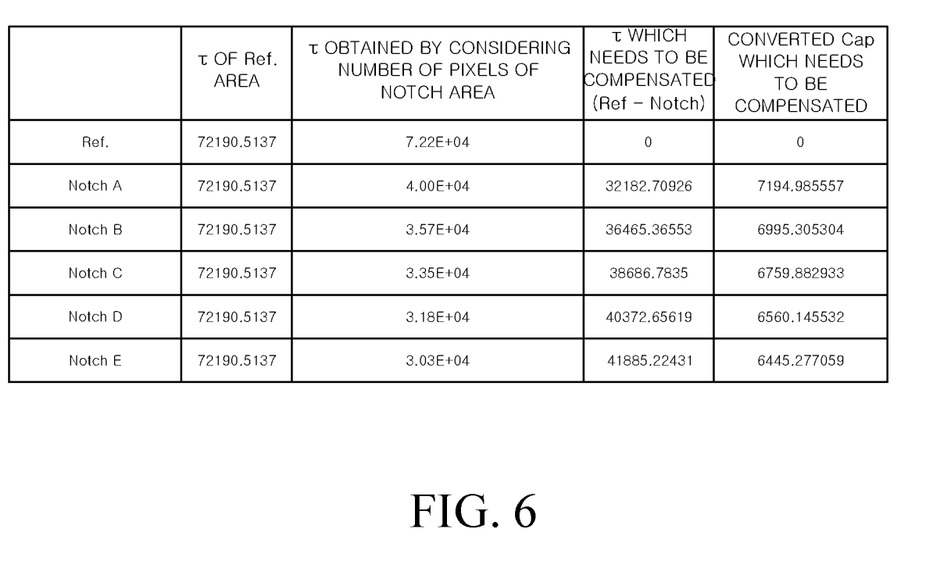
FIG. 6 is a view for explaining a capacitance compensating method of a display device according to an exemplary embodiment of the present disclosure.

FIG. 2 is an enlarged view of an area A of FIG. 1. FIG. 3 is a cross-sectional view of a pixel structure of a display device according to an exemplary embodiment of the present disclosure. FIG. 4 is an enlarged view of an area B of FIG. 1. FIGS. 5A to 5C are cross-sectional views for explaining overlapping between a power line and a connecting metal line of a display device according to an exemplary embodiment of the present disclosure. FIG. 6 is a view for explaining a capacitance compensating method of a display device according to an exemplary embodiment of the present disclosure.

Referring to FIG. 2, the substrate 110 according to an exemplary embodiment of the present disclosure includes a display area AA and a non-display area NA. Specifically, the display area AA may include a first display area AA1 in which an irregularly shaped side is not disposed and a second display area AA2 in which an irregularly shaped side is disposed. The second display area AA2 may include a notch area NTA formed by the irregularly shaped side and include a second-first display area AA21 and a second-second display area AA22 which are separated to the left and the right by the notch area NTA.

A plurality of pixels P is disposed in the first display area AA1 and the second display area AA2, and images may be displayed by the plurality of pixels P. As illustrated in FIG. 3, the plurality of pixels P includes a thin film transistor TR, an organic light emitting diode OLED, a light blocking layer LS, a gate insulating layer GI, first and second insulating layers ILD1 and ILD2, a bank BNK, and an encapsulating layer EN.

In the thin film transistor TR, a buffer layer BUF is disposed on a substrate SUB which is formed of an insulating material such as transparent glass or plastic, and an active layer ACT which is formed of any one of polycrystalline silicon, low-temperature polysilicon, or an oxide semiconductor material is disposed thereon. In this case, when the active layer ACT is formed of any one of polycrystalline silicon, low-temperature polysilicon, or an oxide semiconductor material and is a top-gate type, the light blocking layer LS is disposed below the active layer ACT to block the influence on the characteristic of the thin film transistor TR due to external light. The light blocking layer LS may be formed of a low resistance opaque conductive material which may block the light. For example, the light blocking layer LS may be formed of aluminum based metal such as aluminum (Al) or aluminum alloy (Al alloy), a silver based metal such as silver (Ag) or silver alloy, a copper based metal such as copper (Cu) or copper alloy, a molybdenum based metal such as molybdenum (Mo) or molybdenum alloy, or a low resistance opaque conductive material such as chrome (Cr), tantalum (Ta), or a titanium (Ti). As described above, the gate insulating layer GI is disposed on the substrate SUB covering the light blocking layer LS and the active layer ACT.

The gate insulating layer GI is a layer for insulating the active layer ACT from the gate electrode GE and may be configured by a single layer or multiple layers of an insulating material, for example, a silicon nitride layer SiNx or a silicon oxide layer SiO2, but is not limited thereto. The gate electrode GE is disposed on the gate insulating layer GI.

The gate electrode GE is disposed above the active layer ACT. The gate electrode GE may be formed of a low resistance opaque conductive material. For example, the gate electrode GE may be formed of an aluminum based metal such as aluminum (Al) or aluminum alloy (Al alloy), a silver based metal such as silver (Ag) or silver alloy, a copper based metal such as copper (Cu) or copper alloy, a molybdenum based metal such as molybdenum (Mo) or molybdenum alloy, or a low resistance opaque conductive material such as chrome (Cr), tantalum (Ta), or a titanium (Ti). As described above, a first insulating layer ILD1 which is formed of an insulating material is disposed on the gate electrode GE.

A source electrode SE and a drain electrode DE which is spaced apart from the source electrode SE are disposed on the first insulating layer ILD1. The source electrode SE and the drain electrode DE are electrically connected to the active layer ACT through contact holes formed in the gate insulating layer GI and the first insulating layer ILD1. For example, the source electrode SE and the drain electrode DE may be formed of an aluminum based metal such as aluminum (Al) or aluminum alloy (Al alloy), a silver based metal such as silver (Ag) or silver alloy, a copper based metal such as copper (Cu) or copper alloy, a molybdenum based metal such as molybdenum (Mo) or molybdenum alloy, or a low resistance opaque conductive material such as chrome (Cr), tantalum (Ta), or a titanium (Ti). As described above, the thin film transistor TR including the active layer ACT, the gate electrode GE, the source electrode SE, and the drain electrode DE is disposed on the substrate SUB.

The second insulating layer ILD2 formed of an insulating material is disposed on the source electrode SE and the drain electrode DE and a planarization layer PAC is disposed on the second insulating layer ILD2. The planarization layer PAC may be formed of an organic insulating material, for example, an organic material which may planarize an upper surface, such as polyimide. A first electrode E1 and a bank BNK are disposed on the planarization layer PAC.

The first electrode E1 may be an anode and is electrically connected to the drain electrode DE through contact holes formed on the second insulating layer ILD2 and the planarization layer PAC. Even though not illustrated, a reflective layer may be further disposed below the first electrode E1.

The bank BNK may be disposed to cover a part of the first electrode E1 and may define an emission area where an organic light emitting layer EML is disposed to emit light. That is, the bank BNK is formed of an insulating material and the organic light emitting layer EML is disposed in an opening of the bank BNK to emit light. The organic light emitting layer EML is disposed on the first electrode E1 which is partially exposed by the bank BNK.

The organic light emitting layer EML may include a hole injection layer, a hole transport layer, a light emitting layer, an electron transport layer, and an electron injection layer. A second electrode E2 is disposed above the organic light emitting layer EML and the bank BNK.

The second electrode E2 may be a cathode and may be formed of a transparent conductive material. For example, the transparent conductive material may consist of tin oxide (TO), indium tin oxide (ITO), indium zinc oxide (IZO), or indium zinc tin oxide (ITZO), but is not limited thereto. Such a second electrode E2 may form the organic light emitting diode OLED together with the first electrode E1 and the organic light emitting layer EML.

The encapsulating layer EN is disposed above the organic light emitting diode OLED so as to protect the organic light emitting diode OLED and suppress foreign substances which may be generated from the outside or during the process from entering the organic light emitting diode OLED. The encapsulating layer EN may have a structure in which a plurality of inorganic layers and a plurality of organic layers are alternately disposed. Although in the exemplary embodiment of the present disclosure, a pixel including an organic light emitting diode OLED is described as an example, it is not limited thereto and the pixel may include a liquid crystal element.

The second display area AA2 of the display area AA in which the plurality of pixels P is disposed has a concave portion defined by a shape of the irregularly shaped side. That is, as illustrated in FIGS. 1 and 2, the second display area AA2 of the display area AA may have a notch area NTA which is inwardly recessed. The notch area NTA may be a non-display area NA in which pixels are not disposed, as described above.

The gate lines GL disposed in the second display area AA2 are shorter than the gate lines GL disposed in the first display area AA1, due to the notch area NTA. Therefore, there may be a difference between the scan load amount of the first display area AA1 and the scan load amount of the second display area AA2. However, generally, a data signal output from the data driver 120, e.g. a data voltage, is equally applied to the first display area AA1 and the second display area AA2. Therefore, in the display device including an irregularly shaped side, a scan load difference may be caused in accordance with a length difference of the gate lines so that the luminance of the first display area AA1 and the luminance of the second display area AA2 may be different from each other. More specifically, the luminance of the second display area AA2 is lower than the luminance of the first display area AA1 so as to be visually recognized as a stain.

Therefore, in the notch area NTA according to the exemplary embodiment of the present disclosure, a scan load compensating pattern may be disposed to compensate the scan loads of the plurality of gate lines GL disposed in the second display area AA2. Here, the scan load compensating pattern may be a plurality of connecting metal lines CML, which electrically connects the gate lines GL of the second display area AA2 divided by the notch area NTA, in the notch area NTA. Further, as the scan load compensating pattern according to the exemplary embodiment of the present disclosure, an active layer or a gate line which compensates the capacitance may be disposed in addition to the connecting metal line CML disposed in the notch area NTA. This will be described in more detail with reference to FIGS. 5A to 5C.

The plurality of connecting metal lines CML electrically connects a gate line GL of the second-first display area AA21 and a gate line GL of the second-second display area AA22 which are separated from each other by the notch area NTA. The plurality of connecting metal lines CML may be disposed in accordance with the shape of the notch area NTA. That is, the plurality of connecting metal lines CML may be disposed in accordance with the shape of the concave portion formed in the second display area AA2. Therefore, as illustrated in FIG. 4, the plurality of connecting metal lines CML may be disposed to have a stepped shape in an area B which is curved in accordance with the shape of the concave portion. Therefore, in the display device 100 according to the exemplary embodiment of the present disclosure, the plurality of connecting metal lines CML is disposed to have a stepped shape in the curved area so that the connecting metal lines CML which may compensate the scan load may be disposed without widening the non-display area NA.

The plurality of connecting metal lines CML may be disposed to overlap the high-potential power link line area VDDA or the low-potential power link line area VSSA. As described above, in an overlapping area of the connecting metal lines CML and the high-potential power link line area VDDA or the low-potential power link line area VSSA, as illustrated in FIG. 5A, the connecting metal lines CML are formed of the same material as the gate lines GL of the first and second display areas AA1 and AA2. Further, the connecting metal lines CML are formed on the same layer as the layer on which the gate lines GL are disposed. The connecting metal line CML may form a first capacitance C1 together with the power line PL which is the high-potential power link line or the low-potential power link line disposed on the first insulating layer ILD1. The power line PL may be formed of the same material as the data line DL disposed in the first and second display areas AA1 and AA2 and may be disposed on the same layer. As described above, in the display device 100 according to the exemplary embodiment of the present disclosure, the connecting metal lines CML which electrically connect the gate lines GL of the second display area AA2 which are separated by the arrangement of the notch area NTA are disposed. However, the connecting metal lines CML overlap the power line PL which is the high-potential power link line or the low-potential power link line to form a capacitance. Therefore, an RC delay is equal to that of the first display area AA1 so that the luminance irregularity of the display device 100 due to the scan load difference may be minimized.

In the meantime, in the display device 100 according to the exemplary embodiment of the present disclosure, the RC delay of the first display area AA1 is set as a reference value and an RC delay of the second display area AA2 including the notch area NTA is compared with the reference value. Thereafter, a scan load compensating pattern which may form a capacitance together with the connecting metal line CML disposed in the notch area NTA, that is, a capacitance compensating pattern, may be further disposed.

In order to form the capacitance compensating pattern, first, an RC delay of the first display area AA1 is calculated to be set as a reference value. Referring to FIG. 6, an RC delay τ of the first display area AA1, that is, an RC delay of a reference area (τ of ref. area), is 72190.5137. Since the RC delay τ of the reference area (ref.) is a reference value and an RC delay τ of the notch area A (τ obtained by considering number of pixels of notch area) is 4.00E+04, the RC delay which needs to be compensated is 32182.70926. Therefore, when a capacitance value for solving the problem due to the scan load difference is calculated based on the reference value, the converted capacitance (converted Cap which needs to be compensated) value is determined to be 7194.985557. For reference, the lengths of the gate lines GL of the second display area AA2 which vary due to the formation of the notch area NTA and as a result the scan loads of the pixels increases going from notch area A to notch area E of FIG. 6.

According to the above-described method, after calculating the difference of the reference RC delay and the RC delay of the second display area in which the length of the gate line GL varies due to the notch area NTA, the difference may be converted to a capacitance which needs to be compensated.

The capacitance converted as described above may improve the RC delay of the second display area AA2 and may be implemented by additionally forming a compensating pattern which may form a capacitance together with the connecting metal line disposed in the notch area NTA to minimize deterioration of an image quality of the display device 100 due to the arrangement of the irregularly shaped side.

Referring to FIG. 5B, active layers ACT of the first and second display areas AA1 and AA2 are additionally disposed below the gate insulating layer GI to further form a capacitance, and a contact hole CNT is formed in the gate insulating layer GI to electrically connect the power line PL and the active layer ACT through the contact hole CNT. Therefore, a second capacitance C2 may be formed in addition to the first capacitance C1 of FIG. 5A.

In the meantime, in order to form the capacitance, as illustrated in FIG. 5C, the light blocking layer LS is additionally disposed in the first display area AA1 and AA2 on the substrate SUB, and the power line PL and the light blocking layer LS are electrically connected through the contact hole CNT disposed in the buffer layer BUF and the gate insulating layer GI. Therefore, in addition to the first capacitance C1 of FIG. 5A, the second capacitance C2, as illustrated in FIG. 5C, may be formed.

Even though not illustrated in the drawings, the light blocking layer LS, the active layer ACT, and the connecting metal line CML are disposed on different layers with an insulating layer therebetween. Therefore, in order to compensate the capacitance, all of the light blocking layer LS, the active layer ACT, and the connecting metal line CML may be disposed to overlap each other.

As described above, in the display device 100 according to the exemplary embodiment of the present disclosure, the capacitance compensating pattern, the active layer ACT, and the light blocking layer LS is further disposed in the display area to compensate the capacitance so that it is equal to the reference value. Therefore, the capacitance compensating pattern may be disposed in the notch area NTA without adding a separate mask.

Therefore, in the display device 100 according to the exemplary embodiment of the present disclosure, a compensating pattern is formed to compensate the capacitance such that the RC delay which varies due to the formation of the irregularly shaped side becomes equal to the RC delay of the display area where the irregularly shaped side is not formed. Therefore, the luminance irregularity of the display device may be reduced.

The exemplary embodiments of the present disclosure can also be described as follows:

According to an aspect of the present disclosure, a display device includes: a substrate which includes a display area having an irregularly shaped side and a non-display area which includes a notch area defined by a shape of the irregularly shaped side of the display area and is disposed to enclose the display area; a plurality of gate lines which is divided to be disposed in a left display area and a right display area by the irregularly shaped side of the display area; and a connecting metal line which connects the plurality of gate lines divided to be disposed in the left display area and the right display area in the notch area.

The connecting metal line may be disposed in accordance with an irregularly shaped structure due to the irregularly shaped side.

The connecting metal line may be disposed to have a stepped shape in an area where the irregularly shaped structural shape due to the irregularly shaped side is curved.

In the notch area, a plurality of high-potential power link lines and a plurality of low-potential power link lines may be further disposed to supply a high-potential power and a low-potential power to the display area.

The connecting metal line may be disposed on a different layer from that of the plurality of high-potential power link lines and the plurality of low-potential power link lines.

The connecting metal line may be disposed to overlap the plurality of high-potential power link lines and the plurality of low-potential power link lines.

In the notch area, a capacitance compensating pattern may be further disposed to compensate a capacitance of the display area having the irregularly shaped side.

The capacitance compensating pattern may be an active layer or a light blocking layer disposed in the display area.

The capacitance compensating pattern may be disposed such that an RC delay of the display area which does not have the irregularly shaped side is set as a reference value and an RC delay of the display area having the irregularly shaped side is compensated to be equal to the reference value.

According to an another aspect of the present disclosure, a display device may include a plurality of pixels disposed in a display area where images are displayed, a plurality of gate lines which applies a gate signal to the plurality of pixels and is disposed to be divided due to one or more irregularly shaped sides among four sides of the display area, a plurality of power lines which applies a high-potential power and a low-potential power to the plurality of pixels, a plurality of connecting metal lines which is disposed below the plurality of power lines and connects the plurality of gate lines which is disposed to be divided due to the irregularly shaped side and a capacitance compensating pattern disposed below the plurality of connecting metal lines.

The number of pixels disposed in a display area where an irregularly shaped side is formed, among the display areas may be different from the number of pixels disposed in a display area where an irregularly shaped side is not formed, due to the irregularly shaped side disposed in the display area.

An RC delay may vary depending on the number of pixels.

The capacitance compensating pattern may compensate a capacitance of the display area where the irregularly shaped side is formed based on the RC delay of the display area where the irregularly shaped side is not formed.

The capacitance compensating pattern may be electrically connected to the plurality of power lines.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only, but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate including a display area which has an irregularly shaped side and a non-display area which includes a notch area defined by a shape of the irregularly shaped side of the display area and is disposed to enclose the display area;
   a plurality of gate lines divided to be disposed in a left display area and a right display area due to the irregularly shaped side of the display area;
   a connecting metal line connecting the plurality of gate lines divided to be disposed in the left display area and the right display area in the notch area; and
   a capacitance compensating pattern disposed in the notch area to compensate a capacitance of the display area having the irregularly shaped side,
   wherein the capacitance compensating pattern is disposed such that an RC delay of the display area which does not have the irregularly shaped side is set as a reference value and an RC delay of the display area having the irregularly shaped side is compensated to be equal to the reference value.

2. The display device according to claim 1, wherein the connecting metal line is disposed in accordance with an irregularly shaped structure due to the irregularly shaped side.

3. The display device according to claim 2, wherein the connecting metal line is disposed to have a stepped shape in an area where the irregularly shaped structure is curved due to the irregularly shaped side.

4. The display device according to claim 1, wherein in the notch area, a plurality of high-potential power link lines and a plurality of low-potential power link lines are further disposed to supply a high-potential power and a low-potential power to the display area.

5. The display device according to claim 4, wherein the connecting metal line is disposed on a different layer from that of the plurality of high-potential power link lines and the plurality of low-potential power link lines.

6. The display device according to claim 5, wherein the connecting metal line is disposed to overlap the plurality of high-potential power link lines or the plurality of low-potential power link lines.

7. The display device according to claim 1, wherein the capacitance compensating pattern is an active layer or a light blocking layer which is disposed in the display area.

8. A display device, comprising:
   a plurality of pixels disposed in a display area where images are displayed;
   a plurality of gate lines configured to apply a gate signal to the plurality of pixels and disposed to be divided due to one or more irregularly shaped sides among four sides of the display area;
   a plurality of power lines configured to apply a high-potential power and a low-potential power to the plurality of pixels;
   a plurality of connecting metal lines disposed below the plurality of power lines and connecting the plurality of gate lines which is disposed to be divided due to the one or more irregularly shaped sides; and
   a capacitance compensating pattern disposed below the plurality of connecting metal lines,
   wherein the capacitance compensating pattern is disposed such that an RC delay of the display area which does not have the irregularly shaped side is set as a reference value and an RC delay of the display area having the irregularly shaped side is compensated to be equal to the reference value.

9. The display device according to claim 8, wherein a number of pixels disposed in a display area where the one or more irregularly shaped sides is formed is different from a number of pixels disposed in a display area where the one or more irregularly shaped sides is not formed, due to the one or more irregularly shaped sides disposed in the display area.

10. The display device according to claim 9, wherein the RC delay varies depending on a number of pixels.

11. The display device according to claim 10, wherein the capacitance compensating pattern is configured to compensate a capacitance of the display area where the one or more irregularly shaped sides is formed based on the RC delay of the display area where the one or more irregularly shaped sides are not formed.

12. The display device according to claim 11, wherein the capacitance compensating pattern is electrically connected to the plurality of power lines.

* * * * *